United States Patent [19]

Lo

[11] Patent Number: 5,726,102
[45] Date of Patent: Mar. 10, 1998

[54] METHOD FOR CONTROLLING ETCH BIAS IN PLASMA ETCH PATTERNING OF INTEGRATED CIRCUIT LAYERS

[75] Inventor: Jui-Cheng Lo, Hsinchu, Taiwan

[73] Assignee: Vanguard International Semiconductor Corporation, Hsinchu, Taiwan

[21] Appl. No.: 661,257

[22] Filed: Jun. 10, 1996

[51] Int. Cl.⁶ .................................................. H01L 21/00
[52] U.S. Cl. .................. 438/718; 438/720; 438/725; 430/313; 430/317; 430/318
[58] Field of Search .............................. 430/313, 323, 430/328, 314, 317, 318; 156/643.1; 438/656.1, 659.1, 694, 717, 725, 718, 719, 720, 721, 722, 723, 724

[56] References Cited

U.S. PATENT DOCUMENTS

| | | | |
|---|---|---|---|
| 4,253,888 | 3/1981 | Kikuchi | 148/187 |
| 4,778,739 | 10/1988 | Protschka | 430/30 |
| 4,859,573 | 8/1989 | Maheras et al. | 430/326 |
| 4,873,176 | 10/1989 | Fisher | 430/313 |
| 5,041,362 | 8/1991 | Douglas | 430/313 |
| 5,219,788 | 6/1993 | Abernathey et al. | 437/187 |
| 5,236,549 | 8/1993 | Shirakawa et al. | 156/643 |
| 5,294,292 | 3/1994 | Yamashita et al. | 156/643 |

*Primary Examiner*—R. Bruce Breneman
*Assistant Examiner*—Luz Alejandro
*Attorney, Agent, or Firm*—George O. Saile; Stephen B. Ackerman; Alek P. Szecsy

[57] ABSTRACT

A method for controlling the plasma etch bias of a patterned layer formed through plasma etching of a blanket layer formed beneath a patterned photoresist layer. There is first formed upon a semiconductor substrate a blanket layer. Formed upon the blanket layer is a patterned photoresist layer. The patterned photoresist layer is then treated through a pre-treatment method to form with a controlled degradation and a controlled flow a hardened patterned photoresist layer from the patterned photoresist layer. The hardened patterned photoresist layer is hardened against a further flow in a subsequent plasma etch method which is employed in etching the patterned layer from the blanket layer while employing the hardened patterned photoresist layer as an etch mask. Finally, the blanket layer is etched through the subsequent plasma etch method to form the patterned layer while employing the hardened patterned photoresist layer as the etch mask.

18 Claims, 3 Drawing Sheets

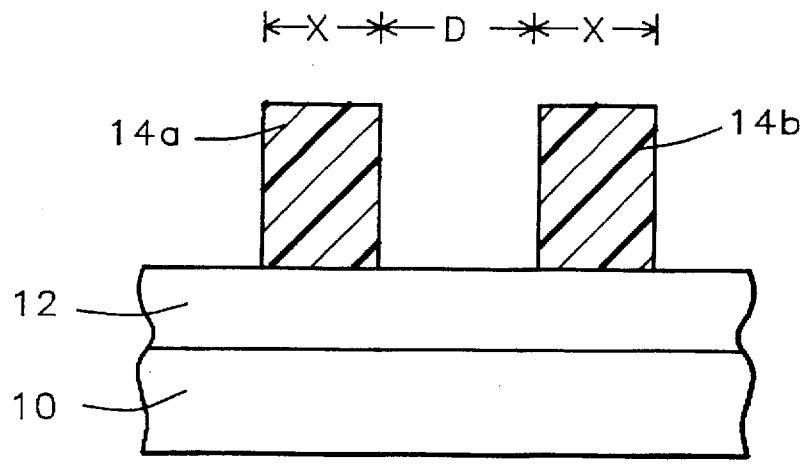
FIG. 1 – Prior Art
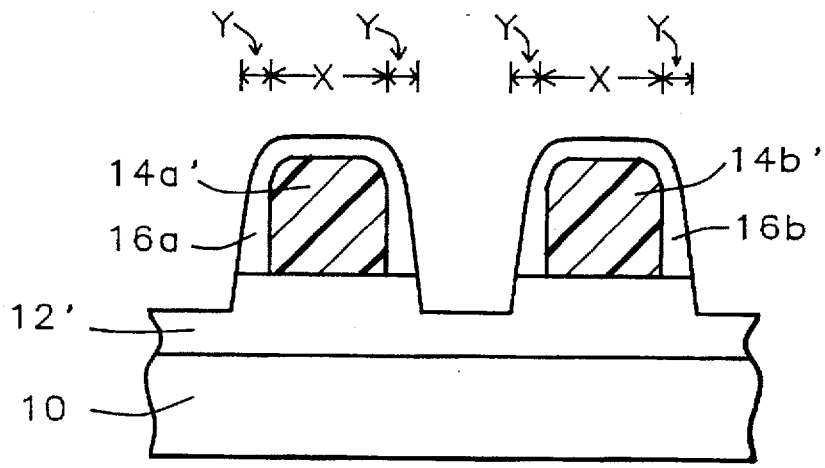
FIG. 2 – Prior Art
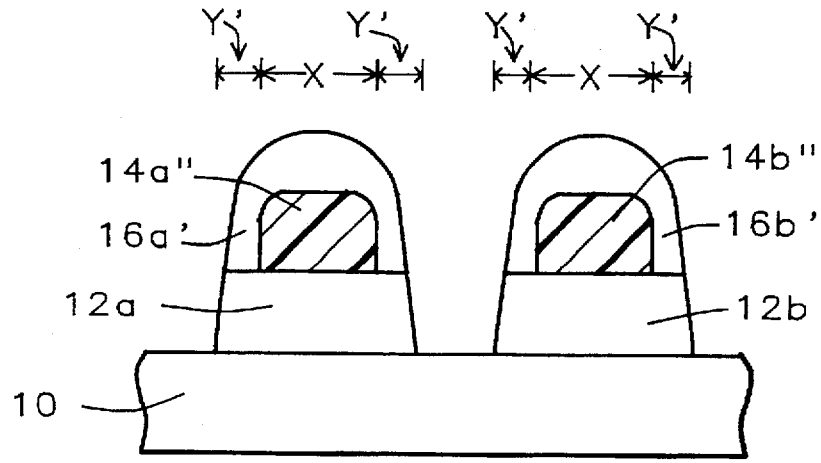
FIG. 3 – Prior Art

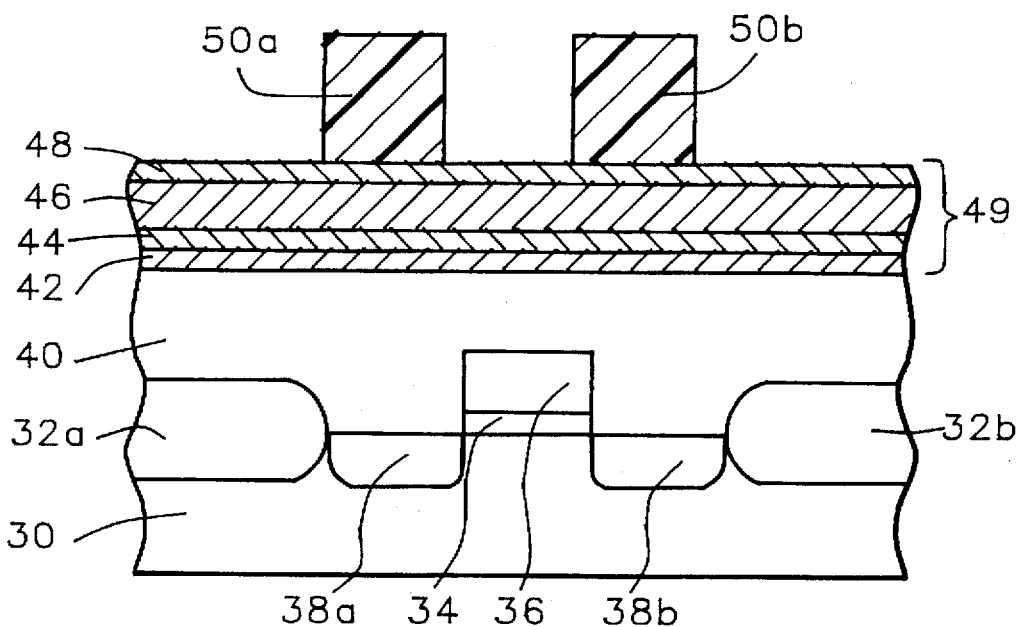
FIG. 4
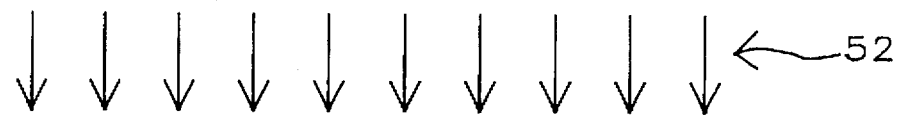
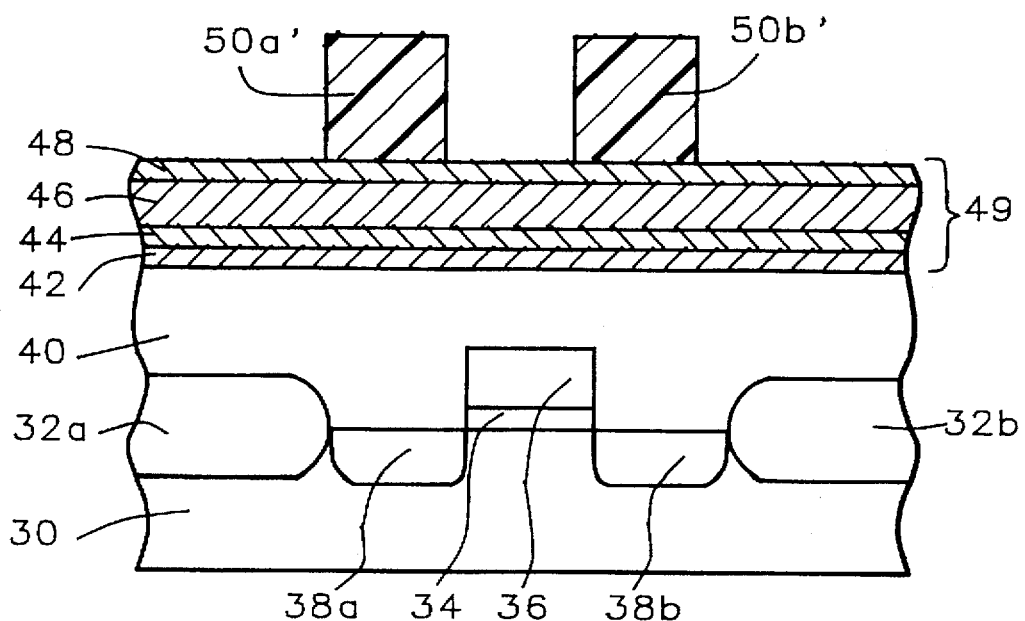
FIG. 5

METHOD FOR CONTROLLING ETCH BIAS IN PLASMA ETCH PATTERNING OF INTEGRATED CIRCUIT LAYERS

BACKGROUND OF THE INVENTION

1. Field of the Invention

The present invention relates generally to etching methods for integrated circuit layers. More particularly, the present invention relates to a method for controlling the plasma etch bias in plasma etch patterning of integrated circuit layers.

2. Description of the Related Art

Integrated circuits are formed upon semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers.

Patterned layers, including but not limited to patterned conductor layers, have conventionally been formed within integrated circuits through photolithographic methods employing plasma etch methods such as Reactive Ion Etch (RIE) plasma etch methods, Magnetically Enhanced Reactive Ion Etch (MERIE) plasma etch methods and Electron Cyclotron Resonance (ECR) plasma etch methods. Photolithographic methods which employ plasma etch methods have typically been preferred in forming patterned layers within advanced integrated circuits since upon etching a blanket layer to form the patterned layer the patterned photoresist etch mask remaining upon the patterned layer may often be efficiently removed, given an appropriate choice of etchant gas composition, within a single plasma reactor chamber or within adjoining plasma reactor chambers of a single multi-chamber plasma reactor cluster tool.

While the sequential blanket layer etching and photoresist etch mask removal through plasma etch methods has served well in forming patterned layers within integrated circuits, the method is not entirely without problems. In particular, it is known in the art that when forming patterned layers through the more highly energetic and/or corrosive plasma etch methods the patterned layers so formed often suffer from considerable plasma etch bias. Such plasma etch bias often occurs when forming integrated circuit elements of Critical Dimension (CD). The plasma etch bias presumably derives from degradation and flow of the patterned photoresist etch mask through which the blanket layer is etched. A series of schematic cross-sectional diagrams illustrating the nature and results of such degradation and flow is shown in FIG. 1 to FIG. 3.

Shown in FIG. 1 is a schematic cross-sectional diagram illustrating a substrate 10, upon whose surface is formed a blanket layer 12 which is desired to be patterned into a patterned layer through a plasma etching method employing a pair of patterned photoresist layers 14a and 14b as photoresist etch mask layers. The patterned photoresist layers 14a and 14b each have a width X upon the blanket layer 12, and the patterned photoresist layers 14a and 14b are separated from each other by a distance D.

Shown in FIG. 2 is the result of further processing of the structure whose schematic cross-sectional diagram is illustrated in FIG. 1. Shown in FIG. 2 is the result of partially etching through a plasma etch method the blanket layer 12 to form the partially patterned blanket layer 12'. Simultaneous with the partial etching of the blanket layer 12 through the plasma etch method, the top surfaces of the patterned photoresist layers 14a and 14b are partially degraded and flow to form the corresponding partially etched patterned photoresist layers 14a' and 14b' with the corresponding partial photoresist residues 16a and 16b formed upon their surfaces. The partial photoresist residues 16a and 16b add an additional width Y to each side of the partially etched patterned photoresist layers 14a' and 14b'. Thus, the width of the top surfaces of the partially patterned blanket layer 12' beneath the partially etched patterned photoresist layers 14a' and 14b' and the corresponding partial photoresist residues 16a and 16b is equal to X plus two times Y.

Shown in FIG. 3 is the result of further processing of the structure whose schematic cross-sectional diagram is illustrated in FIG. 2. Shown in FIG. 3 is the result of fully patterning within a plasma etch method the partially patterned blanket layer 12' to form the patterned layers 12a and 12b. In the process of fully patterning the partially patterned blanket layer 12' to form the patterned layers 12a and 12b, the partially etched patterned photoresist layers 14a' and 14b' are fully etched to form the fully etched patterned photoresist layers 14a" and 14b". In addition, the corresponding partial photoresist residues 16a and 16b grow in size to the corresponding photoresist residues 16a' and 16b'. Due to the continuous simultaneous degradation and flow of the partially etched patterned photoresist layers 14a' and 14b' in forming the photoresist residues 16a' and 16b', the patterned layers 12a and 12b each have a slightly positive taper with a width upon the surface of the substrate 10 of X plus two times Y', where two times Y' is equal to the plasma etch bias.

Under circumstances where the plasma etch bias approaches the separation distance D of the patterned photoresist layers 14a and 14b, there is a likelihood of incomplete separation of the patterned layers 12a and 12b. Under the additional circumstance where the patterned layers 12a and 12b are patterned conductor layers, an electrical short will result between those patterned conductor layers. As is frequently the case in advanced integrated circuit design and fabrication, the width W and the separation distance D of the patterned photoresist layers 14a and 14b will often be of a sufficiently limited magnitude such that compensation for the plasma etch bias increase in width of the patterned layers 12a and 12b through a decrease in the width of the patterned photoresist layers 14a and 14b may be neither feasible nor desirable.

Thus, it is towards the goal of controlling or eliminating within integrated circuits the etch bias of patterned layers formed through plasma etch methods that the present invention is directed.

Methods and materials through which plasmas may be modified to facilitate desirable goals in the manufacture of integrated circuits have been disclosed in the art of integrated circuit manufacture. For example, Yamashita et al., in U.S. Pat. No. 5,294,292 disclose a plasma ashing method through which photoresist residue buildup upon integrated circuits may be limited. Through the method there is controlled the radio frequency power density within a reactor chamber within which a patterned photoresist layer upon an integrated circuit is plasma ashed. In addition, Shirakawa et al., in U.S. Pat. No. 5,236,549 disclose a method for continuously producing a plasma during the intervening time period in switching from a first partial plasma etching method to a second partial plasma etching method when sequentially anisotropic plasma etching a single substrate. The method eliminates non-plasma isotropic etching which would otherwise occur intervening the two anisotropic partial plasma etching methods.

Desirable in the art are additional methods through which plasmas may be modified to achieve desirable goals within integrated circuit fabrication. Particularly desirable are methods through which plasma etch methods may be modified to control the etch bias of patterned layers formed through those plasma etch methods. Most desirable are methods through which plasma etch methods may be modified to substantially eliminate the Critical Dimension (CD) etch bias of patterned layers formed through those plasma etch methods.

SUMMARY OF THE INVENTION

A first object of the present invention is to provide a method for controlling within integrated circuits the etch bias of patterned layers formed through plasma etch methods.

A second object of the present invention is to provide a method for substantially eliminating within integrated circuits the Critical Dimension (CD) etch bias of patterned layers formed through plasma etch methods.

A third object of the present invention is to provide a method in accord with the first object of the present invention or the second object of the present invention, which method is readily manufacturable.

In accord with the objects of the present invention, there is provided by the present invention a method for limiting or substantially eliminating within integrated circuits the etch bias of patterned layers formed through plasma etch methods. To practice the method of the present invention, there is first formed upon a semiconductor substrate a blanket layer. There is then formed upon the blanket layer a patterned photoresist layer. The patterned photoresist layer is then treated through a pre-treatment method to form with a controlled degradation and a controlled flow a hardened patterned photoresist layer from the patterned photoresist layer. The hardened patterned photoresist layer is hardened against a further flow in a subsequent plasma etch method which is employed in etching a patterned layer from the blanket layer while employing the hardened patterned photoresist layer as an etch mask. Finally, the blanket layer is etched through the subsequent plasma etch method to form the patterned layer while employing the hardened patterned photoresist layer as the etch mask.

Through the method of the present invention, there may be controlled or substantially eliminated the etch bias, including the Critical Dimension (CD) etch bias, of patterned layers formed within integrated circuits through plasma etch methods. By hardening a patterned photoresist layer through a pre-treatment method to provide with a controlled degradation and a controlled flow a hardened patterned photoresist layer which is hardened against a further flow in a subsequent plasma etch method employed in forming a patterned layer from a blanket layer which is formed beneath the hardened patterned photoresist layer, the plasma etch bias of the patterned layer can be controlled or substantially eliminated. Through controlling the flow of the hardened patterned photoresist layer within the pre-treatment method and limiting further flow of the hardened patterned photoresist layer in the subsequent plasma etch method, the etch bias of the patterned layer may be controlled or substantially eliminated. The method of the present invention is equally applicable in substantially eliminating Critical Dimension (CD) plasma etch bias as well as in controlling non-Critical Dimension (CD) plasma etch bias.

The method of the present invention is readily manufacturable. The method of the present invention provides for use of a pre-treatment method to form from a patterned photoresist layer a hardened patterned photoresist layer, where the hardened patterned photoresist layer is employed within a plasma etch method in forming a patterned layer from a blanket layer formed beneath the hardened patterned photoresist layer. Specific pre-treatment methods which may be employed in forming the hardened patterned photoresist layer from the patterned photoresist layer are disclosed herein. Such pre-treatment methods may be readily undertaken in-situ prior to the plasma etch method through methods and materials as are conventional in the art. Thus, the method of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 to FIG. 3 show a series of schematic cross-sectional diagrams illustrating the results of progressive stages in forming upon a substrate patterned layers which exhibit a plasma etch bias through a plasma etch method conventional in the art of integrated circuit fabrication.

FIG. 4 to FIG. 6 show a series of schematic cross-sectional diagrams illustrating the results of progressive stages in forming within an integrated circuit patterned conductor stack layers with a controlled plasma etch bias through a plasma etch method in accord with the preferred embodiments of the method of the present invention.

DESCRIPTION OF THE PREFERRED EMBODIMENTS

Figure 6:
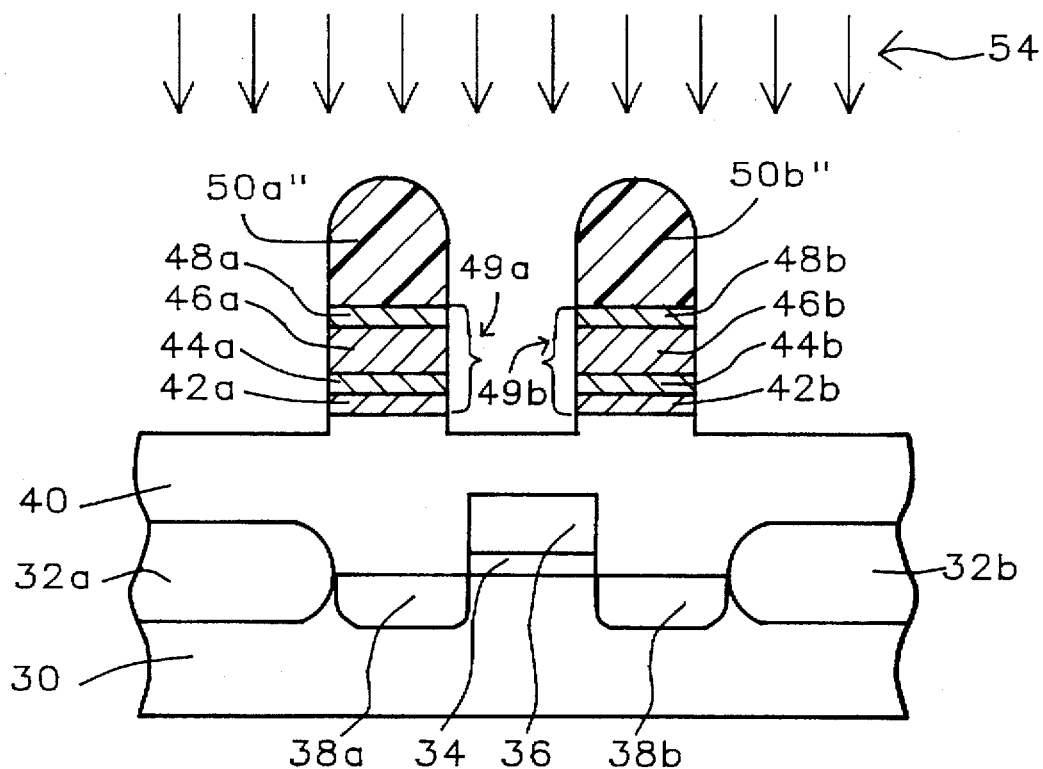

The present invention provides a method for controlling or substantially eliminating the plasma etch bias, including the Critical Dimension (CD) plasma etch bias, of patterned layers formed within integrated circuits through plasma etch methods. The method of the present invention controls or substantially eliminates the plasma etch bias through forming with a controlled degradation and a controlled flow, by means of a pre-treatment method, a hardened patterned photoresist layer from a patterned photoresist layer. The hardened patterned photoresist layer is then employed within a plasma etch method in forming a patterned layer from a blanket layer formed beneath the hardened patterned photoresist layer. The hardened patterned photoresist layer is hardened against further flow in the plasma etch method employed in forming the patterned layer from the blanket layer.

The method of the present invention may be employed in controlling the plasma etch bias within plasma etch method patterning of various types of patterned layers from corresponding blanket layers. The method of the present invention may be employed in controlling the plasma etch bias within plasma etch method patterning of patterned layers formed from blanket layers including but not limited to blanket conductor layers, blanket insulator layers, blanket semiconductor layers and blanket photo-active layers. The method of the present invention has broad applicability in controlling the plasma etch bias of patterned layers formed through plasma etch methods.

In addition to the broad range of patterned layers whose etch bias when formed through a plasma etch method may be controlled through the method of the present invention, the method of the present invention also provides that those patterned layers may be employed within various types of integrated circuits. Thus, the method of the present invention may be employed in controlling the etch bias of patterned layers when formed through plasma etch methods within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention has broad applicability within both the types of patterned layers whose plasma etch bias is controlled and the types of integrated circuits into which are formed those patterned layers through the method of the present invention.

Referring now to FIG. 4 to FIG. 6, there is shown a series of schematic cross-sectional diagrams illustrating the results of progressive stages in forming within an integrated circuit patterned conductor stack layers through a plasma etch method in accord with the preferred embodiments of the method of the present invention. Shown in FIG. 4 is a schematic cross-sectional diagram of the integrated circuit at a point immediately prior to the point at which the method of the present invention may be employed.

Shown in FIG. 4 is a semiconductor substrate 30 having formed within and upon its surface isolation regions 32a and 32b which define the active region of the semiconductor substrate 30. Although semiconductor substrates are known in the art with either dopant polarity, any dopant concentration and any crystallographic orientation, for the preferred embodiments of the method of the present invention, the semiconductor substrate 30 is preferably a (100) silicon semiconductor substrate 30 having a N- or P- doping. Similarly, although it is known in the art that isolation regions may be formed within and/or upon semiconductor substrates through methods including but not limited to thermal oxide growth methods and isolation region deposition/patterning methods, for the preferred embodiments of the method of the present invention, the isolation regions 32a and 32b are preferably formed within and upon the semiconductor substrate 30 through a thermal oxide growth method which forms isolation regions 32a and 32b of silicon oxide within and upon the semiconductor substrate 30.

As is also shown in FIG. 4, there is formed within the active region of the semiconductor substrate 30 a Field Effect Transistor (FET) structure comprising a gate oxide layer 34, a gate electrode 36 and a pair of source/drain regions 38a and 38b. The gate oxide layer 34, the gate electrode 36 and the pair of source/drain regions 38a and 38b may be formed through methods and materials as are conventional in the art. For example, the gate oxide layer 34 is typically, although not exclusively, formed through patterning through methods as are conventional in the art of a blanket gate oxide layer formed through thermal oxidation of the active region of the semiconductor substrate 30 at a temperature of from about 800 to about 900 degrees centigrade to form a blanket gate oxide layer of typical thickness about 50 to about 150 angstroms. In addition, the gate electrode 36 is typically formed through patterning through methods as are conventional in the art of a blanket layer of gate electrode material formed upon the blanket gate oxide layer from a highly doped polysilicon material at a thickness of from about 1500 to about 2500 angstroms. Finally, the source/drain regions 38a and 38b are typically formed into the semiconductor substrate 30 through ion implantation of a suitable dopant into the appropriate portions of the active region of the semiconductor substrate 30 at an ion implantation dose of from about 3E13 to about 3E15 ions per square centimeter and an ion implantation energy of from about 40 to about 60 keV.

There is also shown in FIG. 4 the presence of a planarized Pre-Metal Dielectric (PMD) layer 40 formed upon the semiconductor substrate and the Field Effect Transistor (FET) structure. Methods and materials through which planarized dielectric layers may be formed within integrated circuits are known in the art of integrated circuit manufacture. Planarized dielectric layers are typically formed within integrated circuits through planarizing through methods as are conventional in the art of conformal dielectric layers formed within integrated circuits. Conformal dielectric layers may be formed within integrated circuits through methods including but not limited to Chemical Vapor Deposition (CVD) methods, Plasma Enhanced Chemical Vapor Deposition (PECVD) methods and Physical Vapor Deposition (PVD) sputtering methods through which may be formed conformal dielectric layers of dielectric materials including but not limited to silicon oxide dielectric materials, silicon nitride dielectric materials and silicon oxynitride dielectric materials. For the preferred embodiments of the method of the present invention, the planarized Pre-Metal Dielectric (PMD) layer 40 is preferably formed through planarizing through a Chemical-Mechanical Polish (CMP) planarizing method or Reactive Ion Etch (RIE) etch-back planarizing method as is common in the art a conformal dielectric layer of silicon oxide formed through a Plasma Enhanced Chemical Vapor Deposition (PECVD) method, as is also common in the art. Preferably, the planarized Pre-Metal Dielectric (PMD) layer 40 is from about 3000 to about 9000 angstroms thick.

In addition, there is also shown in FIG. 4 a series of four blanket layers which form a blanket conductor stack layer 49. The four blanket layers are: (1) a blanket titanium layer 42 preferably formed to a thickness of from about 300 to about 1200 angstroms upon the planarized Pre-Metal Dielectric (PMD) layer 40; (2) a blanket lower titanium nitride layer 44 preferably formed to a thickness of from about 600 to about 1500 angstroms upon the blanket titanium layer 42; (3) a blanket aluminum containing conductor layer 46 preferably formed to a thickness of from about 3000 to about 11000 angstroms upon the blanket lower titanium nitride layer 44; and (4) a blanket upper titanium nitride layer 48 preferably formed to a thickness of from about 200 to about 500 angstroms upon the blanket aluminum containing conductor layer 46. Each of the four preceding blanket layers within the blanket conductor stack layer 49 may be formed through methods as are conventional in the art including but not limited to thermally assisted evaporation methods, electron beam assisted evaporation methods and Physical Vapor Deposition (PVD) sputtering methods.

Finally, there is also shown in FIG. 4 the presence of a pair of patterned photoresist layers 50a and 50b formed upon the blanket upper titanium nitride layer 48. The preferred embodiments of the method of the present invention provide most value in controlling the plasma etch bias of patterned conductor stack layers formed through a plasma etch method patterning of the blanket conductor stack layer 49 employing the patterned photoresist layers 50a and 50b as an etch mask when the patterned photoresist layers 50a and 50b are formed of a photoresist material which is: (1) susceptible to flow when exposed to the plasma etch method which is employed in etching the patterned conductor stack layers from the blanket conductor stack layer 49; and (2) readily hardened against that flow through a pre-treatment method of composition and parameters as disclosed below. It has been found experimentally that several common photoresist materials fulfill the foregoing two criteria and may be employed in forming the patterned photoresist layers 50a and 50b. The photoresist materials include but are not limited to novolak photoresist materials and Poly Methyl Meth Acrylate (PMMA) photoresist materials which include appropriate photoactive compounds and solvents. Preferably the patterned photoresist layers 50a and 50b are from about 7000 to about 20000 angstroms thick.

Referring now to FIG. 5, there is shown a schematic cross sectional diagram illustrating the results of further processing of the integrated circuit whose schematic cross-sectional diagram is illustrated in FIG. 4. Shown in FIG. 5 is the presence of a hardening pre-treatment composition 52 through which the patterned photoresist layers 50a and 50b are hardened to form the hardened patterned photoresist layers 50a' and 50b'. For a general application of the method of the present invention, the method and materials under which the hardening pre-treatment composition 52 is selected and employed will be determined in accord with nature of the subsequent plasma etching method employed in forming patterned layers from the blanket layer which is formed beneath the patterned photoresist layers 50a and 50b. For the preferred embodiments of the method of the present invention, where the blanket layer formed beneath the patterned photoresist layers 50a and 50b is the blanket conductor stack layer 49, there has been determined experimentally a minimum of three selections for the hardening pre-treatment composition 52 such that the hardening pre-treatment composition 52 will form from the patterned photoresist layers 50a and 50b with a controlled degradation and a controlled flow the hardened patterned photoresist layers 50a' and 50b' which in turn exhibit a controlled flow in a subsequent plasma etching method employed in etching patterned conductor stack layers from the blanket conductor stack layer 49 while employing the hardened patterned photoresist layers 50a' and 50b' as an etch mask.

Thus, for the preferred embodiments of the method of the present invention, a first selection for the hardening pre-treatment composition 52 is an oxygen/nitrous oxide plasma treatment employed at: (1) an oxygen flow rate of from about 10 to about 2000 standard cubic centimeters per minute (sccm); (2) a nitrous oxide flow rate of from about 10 to about 2000 standard cubic centimeters per minute (sccm); (3) a radio frequency power of from about 50 to about 350 watts at a radio frequency of 13.56 MHz; (4) a reactor chamber pressure of about 500 to about 800 mtorr; (5) a substrate temperature of from about 150 to about 250 degrees centigrade; and (6) an exposure time of from about 5 to about 60 seconds.

In addition, for the preferred embodiments of the method of the present invention, a second selection for the hardening pre-treatment composition 52 is an oxygen plasma treatment employed at: (1) an oxygen flow rate of from about 10 to about 3000 standard cubic centimeters per minute (sccm); (2) a reactor chamber pressure of from about 1 to about 20 mtorr; (3) a substrate temperature of from about 20 to about 60 degrees centigrade; and (4) an exposure time of from about 5 to about 60 seconds.

Finally, for the preferred embodiments of the method of the present invention, a third selection for the hardening pre-treatment composition 52 is an oxygen-chlorine plasma treatment employed at: (1) an oxygen flow rate of from about 10 to about 3000 standard cubic centimeters per minute; (2) a chlorine flow rate of from about 10 to about 200 standard cubic centimeters per minute; (3) a reactor chamber pressure of from about 1 to about 20 mtorr; (4) a substrate temperature of from about 20 to about 60 degrees centigrade; and (5) an exposure time of from about 5 to about 60 seconds.

Although not explicitly disclosed, the method of the present invention also contemplates that various additional mixtures of oxygen, nitrous oxide, chlorine and/or other oxidizing gases, with or without non-reactive diluent gases such as nitrogen, argon or helium may also be employed in providing a hardening pre-treatment composition 52 for hardening the patterned photoresist layers 50a and 50b within the preferred embodiments of the method of the present invention.

Referring now to FIG. 6, there is shown a schematic cross-sectional diagram illustrating the results of further processing of the integrated circuit whose schematic cross-sectional diagram is illustrated in FIG. 5. Shown in FIG. 6 is the results of forming through a plasma etch method the patterned conductor stack layers 49a and 49b from the blanket conductor stack layer 49. The patterned conductor stack layers 49a and 49b are comprised of the corresponding patterned titanium, titanium nitride and aluminum containing conductor layers. To form the patterned conductor stack layers 49a and 49b from the blanket conductor stack layer 49 through the plasma etch method, there is employed a plasma 54 appropriate to the materials from which is formed the blanket conductor stack layer 49. The plasma may be formed through methods as conventional in the art, including but not limited to Reactive Ion Etch (RIE) plasma methods, Magnetically Enhanced Reactive Ion Etch (MERIE) plasma methods and Electron Cyclotron Resonance (ECR) plasma methods.

For the preferred embodiments of the method of the present invention, the plasma 54 is preferably formed through an Electron Cyclotron Resonance (ECR) plasma method and the plasma 54 preferably employs a boron trichloride/chlorine reactant gas composition at: (1) a boron trichloride flow rate of from about 5 to about 200 standard cubic centimeters per minute; (2) a chlorine flow rate of from about 5 to about 200 standard cubic centimeters per minute; (3) a reactor chamber pressure of from about 1 to about 20 mtorr; and (4) a substrate temperature of from about 20 to about 60 degrees centigrade. When employing the plasma 54 with the boron trichloride/chlorine reactant gas composition through the plasma etch method to form the patterned conductor stack layers 49a and 49b from the blanket conductor stack layer 49, there is preferably employed a three-step plasma etch method. The three-step plasma etch method preferably employs a first breakthrough etch (BE) step at a radio frequency power of about 100 to about 150 watts for a time period of about 5 to about 30 seconds. Following the first breakthrough etch (BE) step is a second main etch (ME) step typically at a somewhat lower radio frequency power in the range of from about 90 to about 150 watts for a time period of from about 30 to about 80 seconds. Finally, following the second main etch (ME) step is a third over etch (OE) step, typically under equivalent radio frequency power conditions employed in the second main etch (ME) step and/or breakthrough etch (BE) step for a time period of from about 40 to about 120 percent of the time period employed in the main etch (ME) step. When the third over etch (OE) step is employed within the plasma etch method, it is common for the surfaces of the planarized Pre-Metal Dielectric (PMD) layer 40 exposed between the patterned conductor stack layers 49a and 49b to be recessed as illustrated in FIG. 6, thus forming an etched planarized Pre-Metal Dielectric layer 40'.

Simultaneously with forming the patterned conductor stack layers 49a and 49b from the blanket conductor stack layer 49, the hardened patterned photoresist layers 50a' and 50b' are also etched within the plasma 54 to form the etched hardened photoresist layers 50a" and 50b". In comparison with otherwise equivalent photoresist layers which have not been exposed to the hardening pre-treatment composition 52, the etched hardened photoresist layers 50a" and 50b" formed through the preferred embodiments of the method of the present invention will exhibit less flow in the plasma 54, thus yielding patterned conductor stack layers 49a and 49b with a controlled plasma etch bias or a substantially eliminated plasma etch bias.

Following the formation of the patterned conductor stack layers 49a and 49b from the blanket conductor stack layer 49 through the boron trichloride/chlorine plasma 54 of the preferred embodiments of the method of the present invention, the etched hardened patterned photoresist layers 50a" and 50b" may be removed through methods as are conventional in the art, including but not limited to plasma stripping methods and wet chemical stripping methods. Plasma stripping methods are typically preferred for removing the etched patterned photoresist layers 50a" and 50b" since such methods may often be undertaken sequentially in-situ either within the same reactor chamber as employed in providing the hardening pre-treatment composition 52 and forming the plasma 54, or in adjoining reactor chambers of a single multi-chamber cluster tool employed in providing the hardening pre-treatment composition 52 and the plasma 54. Although not specifically illustrated within FIG. 5 and FIG. 6, the hardening pre-treatment composition 52 and the plasma 54 are preferably provided sequentially in-situ within a single reactor chamber.

Upon removing the etched hardened patterned photoresist layers 50a" and 50b" from the corresponding patterned conductor stack layers 49a and 49b, there is formed within an integrated circuit the pair of patterned conductor stack layers 49a and 49b with controlled etch bias. As is understood by a person skilled in the art, the preferred embodiment of the method of the present invention may be employed in forming within integrated circuits patterned conductor stack layers in positions other than those occupied by the patterned conductor stack layers 49a and 49b. Although not specifically illustrated within FIG. 4 to FIG. 6, the preferred embodiments of the method of the present invention may be employed in forming patterned conductor stack layers or other patterned conductor layers at locations further removed from the semiconductor substrate 30 than the patterned conductor stack layers 49a and 49b. Such patterned conductor stack layers or other patterned conductor layers will typically provide the second, the third and/or other upper level patterned conductor stack layers or patterned conductor layers within the integrated circuit within which is formed the patterned conductor stack layers 49a and 49b.

As is further understood by a person skilled in the art, and as has been noted above, the general method of the present invention may also be employed in forming, without undue experimentation, within integrated circuits plasma etch bias controlled patterned layers of various other types, including but not limited to other patterned conductor layers, patterned insulator layers, patterned semiconductor layers and patterned photo-active layers. Typically, the plasma etch bias controlled layers of other types will have a thickness of from about 2000 to about 15000 angstroms. In order to provide plasma etch bias controlled patterned layers of other types, there is first needed a determination of an appropriate hardening pre-treatment composition and conditions under which a patterned photoresist layer employed in patterning those other patterned layers may be hardened to provide controlled flow in a plasma which is employed forming those other patterned layers.

EXAMPLES

For use in all of the following EXAMPLES, there was prepared a series of (100) silicon semiconductor substrates having formed upon their surfaces planarized Pre-Metal Dielectric layers of silicon oxide formed through a Plasma Enhanced Chemical Vapor Deposition (PECVD) method. The thickness of the planarized Pre-Metal Dielectric (PMD) layers was about 6000 angstroms each. Formed upon each of the planarized Pre-Metal Dielectric (PMD) layers was a blanket conductor stack layer formed from: (1) a blanket titanium layer formed upon the planarized Pre-Metal Dielectric (PMD) layer at a thickness of about 400 angstroms; (2) a blanket lower titanium nitride layer formed upon the blanket titanium layer at a thickness of about 1200 angstroms; (3) a blanket aluminum containing conductor layer of weight percent composition aluminum:copper:silicon about 98.5:0.5:1.0 formed upon the blanket lower titanium nitride layer at a thickness of about 4100 angstroms; and (4) a blanket upper titanium nitride layer formed upon the blanket aluminum containing conductor layer at a thickness of about 300 angstroms. The four blanket layers within the blanket conductor stack layer were formed through sequential Physical Vapor Deposition (PVD) sputtering methods as are conventional in the art.

Formed upon the blanket conductor stack layers were patterned photoresist layers of thickness about 16500 angstroms from a MCPRi-PFi-7350i novolak type photoresist material available from Mitsumishi Co., Japan. The linewidth of the patterns in the patterned photoresist layers were about 0.65 microns and the patterns within the patterned photoresist layers were separated by apertures of about 0.65 microns width.

The first series of EXAMPLES was directed towards demonstrating the ability of the method of the present invention to control the plasma etch bias of patterned conductor stack layers formed through plasma etching the blanket conductor stack layer employing the patterned photoresist layers as an etch mask.

For comparison purposes, the conventional conditions under which the blanket conductor stack layer was etched to form patterned conductor stack layers employed a boron trichloride/chlorine plasma at: (1) a boron trichloride flow rate of 70 standard cubic centimeters per minute (sccm); (2) a chlorine flow rate of about 130 standard cubic centimeters per minute (sccm); (3) a reactor chamber pressure of about 16 mtorr; and (4) a substrate temperature of about 40 degrees centigrade. The boron trichloride/chlorine plasma was employed in a three-step plasma etch method. The first plasma etch step in the three-step plasma etch method employed a breakthrough etch (BE) at a radio frequency power of about 150 watts for a time period of about 10 seconds. The second plasma etch step in the three-step plasma etch method employed a main etch (ME) at a radio frequency power of about 100 watts for a time period of about 46.7 seconds. The third plasma etch step in the three-step plasma etch method employed an over etch (OE)

at a radio frequency power of about 130 watts for a time period of about 34.7 seconds. Through this three-step plasma etch method there was typically conventionally observed a plasma etch bias of the patterned conductor stack layers of about 0.15 microns. The plasma etch bias was determined as the after etch inspection (AEI) width of the patterned conductor stack layers minus the after development inspection (ADI) width of the patterned photoresist layers (ie: AEI–ADI).

In order to demonstrate that the method of the present invention provides substantial reductions in plasma etch bias under plasma etch conditions similar to those conventionally employed in forming patterned conductor stack layers, the patterned photoresist layers upon two semiconductor substrates were exposed to an in-situ hardening pre-treatment composition employing an oxygen plasma at: (1) an oxygen flow rate of about 200 standard cubic centimeter (sccm); (2) a reactor chamber pressure of about 16 mtorr; (3) a substrate temperature of about 40 degrees centigrade; and (4) a pre-treatment time period of about 20 seconds. This in-situ oxygen plasma pre-treatment (PT) was provided at a microwave power of about 300 mA which was maintained through a breakthrough etch (BE), main etch (ME) and over etch (OE) otherwise conventional in the art with exceptions as noted in TABLE I. Also reported in TABLE I is the plasma etch bias for the patterned conductor stack layers formed upon the two semiconductor substrates through the plasma etch method.

TABLE I

| EXAMPLE | Process Conditions | Plasma Etch Bias |
| --- | --- | --- |
| 1 | PT: 200 sccm O2 for 20 sec<br>BE: 150 watts for 10 sec<br>ME: 110 watts for 46.7 sec<br>OE: 130 watts for 34.7 sec | 0.031 microns |
| 2 | PT: 200 sccm O2 for 20 sec<br>BE: 150 watts for 10 sec<br>ME: 120 watts for 46.7 sec<br>OE: 130 watts for 34.7 sec | 0.036 |

From review of the data in TABLE I it is seen that through the exposure to the hardening pre-treatment composition in accord with the preferred embodiments of the method of the present invention, there was provided patterned conductor stack layers exhibiting a plasma etch bias substantially reduced in comparison with patterned conductor stack layers formed through an otherwise nominally equivalent conventional method from which exposure to the hardening pre-treatment composition was absent.

To further define the present invention, additional variations upon the hardening pre-treatment composition were evaluated, along with slight variations of the breakthrough etch (BE), the main etch (ME) and the over etch (OE) process steps. In a first variation there was employed as the hardening pre-treatment composition an oxygen/nitrous oxide plasma at: (1) an oxygen flow rate of about 400 standard cubic centimeters per minute (sccm); (2) a nitrous oxide flow rate of about 20 standard cubic centimeters per minute; (3) a radio frequency power of about 350 watts; (4) a reactor chamber pressure of about 650 mtorr; (5) a substrate temperature of 200 degrees centigrade; and (6) a pre-treatment time period of about 60 seconds.

In a second variation there was employed as the hardening pre-treatment composition an oxygen plasma at: (1) a flow of about 200 standard cubic centimeters per minute (sccm); (2) a pressure of about 16 mtorr; (3) a substrate temperature of about 40 degrees centigrade; and (4) a pre-treatment time period of about 10 seconds.

In a third variation there was employed as the hardening pre-treatment composition an oxygen/chlorine plasma mixture at: (1) an oxygen flow of about 150 standard cubic centimeters per minute (sccm); (2) a chlorine flow of about 150 standard cubic centimeters per minute (sccm); (3) a reactor chamber pressure of 16 mtorr; (4) a substrate temperature of about 40 degrees centigrade; and (5) a pre-treatment time period of about 10 seconds.

Each of the foregoing three variations upon the hardening pre-treatment composition was followed by an otherwise conventional three-step boron trichloride/chlorine plasma etch method for forming the patterned conductor stack layers from the blanket conductor stack layer. The three-step boron trichloride/chlorine plasma etch method employed: (1) a breakthrough etch (BE) at 200 watts for 20 seconds; (2) a main etch (ME) at 130 watts until a measured endpoint; and (3) an over etch (OE) at 100 percent (BE+ME). The results for measured plasma etch biases of patterned conductor stack layers formed as a function of the variation in hardening pre-treatment composition are reported in TABLE II.

TABLE II

| EXAMPLE | Pre-Treatment Composition | Plasma Etch Bias |
| --- | --- | --- |
| 3 | O2/N2O Plasma for 60 sec | −0.022 microns |
| 4 | O2 Plasma for 10 sec | +0.087 |
| 5 | O2/Cl2 Plasma for 10 sec | +0.063 |

As is seen from review of the data in TABLE II, significant reductions in plasma etch bias may also be obtained through the method of the present invention by employing variations upon the hardening pre-treatment composition which include other oxidizing gas mixtures, as well as plasmas formed from other oxidizing gas mixtures.

In order to more fully evaluate the variability of plasma etch bias as a function of hardening pre-treatment compositions which employ oxygen plasmas, the patterned photoresist layers upon a series of semiconductor substrates were exposed to a series of oxygen plasma hardening pre-treatment compositions under conditions otherwise equivalent to the conditions employed with the oxygen plasma hardening pre-treatment composition of EXAMPLE 1, with the exception that the pre-treatment time periods were varied. The measured plasma etch biases for the patterned conductor stack layers formed upon the series of semiconductor substrates is reported in TABLE III.

TABLE III

| EXAMPLE | Oxygen Plasma Pre-Treat Time Period | Plasma Etch Bias |
| --- | --- | --- |
| 6 | 10 sec | 0.05 microns |
| 7 | 20 | 0.03 |
| 8 | 30 | 0.00 |
| 9 | 40 | −0.01 |
| 10 | 50 | −0.03 |
| 11 | 60 | −0.07 |

From review of the data in TABLE III it is seen that by variation of the pre-treatment time period for exposure to an oxygen plasma hardening pre-treatment composition, the plasma etch bias for patterned conductor stack layers formed through the method of the present invention may not only be controlled, but the plasma etch bias may also be tuned to a desired dimension. As illustrated by the plasma etch bias for the patterned conductor stack layers formed within EXAMPLE 8, the plasma etch bias of patterned conductor stack layers may be effectively eliminated through the method of the present invention.

To evaluate the effect of variation of over etch (OE) parameters upon plasma etch bias for patterned conductor stack layers formed in accord with the method of the present invention, the patterned photoresist layers upon a pair of semiconductor substrates was exposed to a hardening pre-treatment composition employing an oxygen plasma at: (1) an oxygen flow rate of 150 standard cubic centimeters per minute (sccm); (2) a reactor chamber pressure of 16 mtorr; (3) a substrate temperature of 40 degrees centigrade; and (4) a pre-treatment time period of 30 seconds. The pair of wafers was then exposed to an otherwise conventional three-step boron trichloride/chlorine plasma etch method employing a breakthrough etch (BE) at a power of 150 watts for a time period of 15 seconds, followed by a main etch (ME) at a power of 120 watts for 40.5 seconds. One of the two substrates then received a 60 percent over etch (OE) at 130 watts while the other substrate received an 80 percent over etch (OE) at 120 watts. The measured values for the plasma etch biases of the patterned conductor stack layers are reported in TABLE IV.

TABLE IV

| EXAMPLE | Over Etch (OE) Plasma Etch Conditions | Plasma Etch Bias |
|---|---|---|
| 12 | 60% OE at 130 watts | 0.01 microns |
| 13 | 80% OE at 120 watts | 0.05 |

From review of the data of TABLE IV it is seen that although there is some variation in plasma etch bias of patterned conductor stack layers as a function of over etch (OE) conditions, the larger reduction in plasma etch bias in forming the patterned conductor stack layers in comparison with patterned conductor stack layers formed through conventional methods presumably derives from exposure of the patterned photoresist layers to the hardening pre-treatment composition.

Finally, although not specifically directed to plasma etch bias measurement for patterned conductor stack layers, there was also measured the etch rates of a series of patterned photoresist layers upon a series of semiconductor substrates exposed to the hardening pre-treatment composition and three-step boron trichloride plasma etch method as outlined in EXAMPLE 1, with the exception that the pre-treatment time period employing the oxygen plasma hardening pre-treatment composition was varied. The measured results for the patterned photoresist layer etch rate (ER) and percent uniformity are reported in TABLE V.

TABLE V

| EXAMPLE | Oxygen Flow Rate | Etch Rate | Percent Uniformity |
|---|---|---|---|
| 14 | 260 sccm | 2060 A/min | 26% |
| 15 | 240 | 2030 | 9 |
| 16 | 220 | 1970 | 12 |
| 17 | 200 | 1950 | 14 |
| 18 | 180 | 1950 | 14 |
| 19 | 160 | 1980 | 14 |
| 20 | 140 | 1930 | 14 |

From review of the data in TABLE V it is seen that patterned photoresist layer etch rates and uniformity are substantially independent of oxygen plasma hardening pre-treatment composition flow within the range of 140–220 standard cubic centimeters per minute (sccm) oxygen plasma hardening pre-treatment composition flow, thus providing a broad process window with respect to patterned photoresist layer hardening pre-treatment through an oxygen hardening pre-treatment composition.

As is understood by a person skilled in the art, the preferred embodiments and EXAMPLES of the present invention are illustrative of the method of the present invention rather than limiting of the method of the present invention. Revisions may be made to methods, materials, structures and dimensions through which are formed the preferred embodiments and EXAMPLES of the method of present invention while still forming embodiments and EXAMPLES which are within the spirit and scope of the method of the present invention, as defined by the appended Claims.

What is claimed is:

1. A method for controlling a plasma etch bias of a patterned layer formed through plasma etching of a blanket layer formed beneath a patterned photoresist etch mask layer comprising:

forming over a semiconductor substrate a blanket layer;

forming over the blanket layer a patterned photoresist layer;

treating the patterned photoresist layer through a pre-treatment method to form a hardened patterned photoresist layer from the patterned photoresist layer, the hardened patterned photoresist layer being hardened against a flow in a subsequent plasma etch method which is employed in etching a patterned layer from the blanket layer while employing the hardened patterned photoresist layer as an etch mask, the pre-treatment method employing a hardening pre-treatment composition chosen from the group of hardening pre-treatment compositions consisting of:

oxygen plasma hardening pre-treatment compositions;

oxygen/nitrous oxide plasma hardening pre-treatment compositions; and oxygen/chlorine plasma hardening pre-treatment compositions; and etching through the subsequent plasma etch method the blanket layer to form the patterned layer while employing the hardened patterned photoresist layer as the etch mask.

2. The method of claim 1 wherein a thickness of the blanket layer is from about 2000 to about 15000 angstroms.

3. The method of claim 2 wherein the blanket layer is chosen from the group of blanket layers consisting of blanket conductor layers, blanket insulator layers, blanket semiconductor layers and blanket photo-sensitive layers.

4. The method of claim 1 wherein a thickness of the patterned photoresist layer is from about 7000 to about 20000 angstroms.

5. The method of claim 4 wherein the patterned photoresist layer is formed from a photoresist material chosen from the group of photoresist materials consisting of novolak photoresist materials and Poly Methyl Meth Acrylate (PMMA) photoresist materials.

6. The method of claim 1 wherein the oxygen plasma hardening pre-treatment composition employs an oxygen flow rate of about 10 to about 3000 standard cubic centimeters per minute (sccm) and a reactor chamber pressure of about 1 to about 20 mtorr for a pre-treatment time period of from about 5 to about 60 seconds.

7. The method of claim 1 wherein the subsequent plasma etch method is chosen from the group of plasma etch methods consisting of Reactive Ion Etch (RIE) plasma etch methods, Magnetically Enhanced Reactive Ion Etch (MERIE) plasma etch methods and Electron Cyclotron Resonance (ECR) plasma etch methods.

8. The method of claim 1 further comprising forming within and upon the semiconductor substrate a series of semiconductor devices, thus forming within and upon the semiconductor substrate an integrated circuit.

9. A method for controlling a plasma etch bias of a patterned conductor layer formed through plasma etching of a blanket conductor layer formed beneath a patterned photoresist layer comprising:

forming over a semiconductor substrate a blanket conductor layer;

forming over the blanket conductor layer a patterned photoresist layer;

treating the patterned photoresist layer through a pre-treatment method to form a hardened patterned photoresist layer from the patterned photoresist layer, the hardened patterned photoresist layer being hardened against a flow in a subsequent plasma etch method which is employed in etching a patterned conductor layer from the blanket conductor layer while employing the hardened patterned photoresist layer as an etch mask, the pre-treatment method employing a hardening pre-treatment composition chosen from the group of hardening pre-treatment compositions consisting of:

oxygen plasma hardening pre-treatment compositions;

oxygen/nitrous oxide plasma hardening pre-treatment compositions; and oxygen/chlorine plasma hardening pre-treatment compositions; and etching through the subsequent plasma etch method the blanket conductor layer to form the patterned conductor layer while employing the hardened patterned photoresist layer as the etch mask.

10. The method of claim 9 wherein a thickness of the blanket conductor layer is from about 4100 to about 14200 angstroms.

11. The method of claim 9 wherein the blanket conductor layer comprises:

a blanket aluminum containing conductor layer formed over the semiconductor substrate at a thickness of about 3000 to about 11000 angstroms; and a blanket titanium nitride layer formed upon the blanket aluminum containing conductor layer at a thickness of about 300 to about 500 angstroms.

12. The method of claim 11 wherein the subsequent plasma etch method employs a boron trichloride/chlorine etchant gas composition.

13. The method of claim 12 wherein the boron trichloride/chlorine etchant gas composition is employed at a radio frequency power of from about 90 to about 150 watts and a reactor chamber pressure of from about 1 to about 20 mtorr.

14. The method of claim 9 wherein a thickness of the patterned photoresist layer is from about 7000 to about 20000 angstroms.

15. The method of claim 14 wherein the patterned photoresist layer is formed from a photoresist material chosen from the group of photoresist materials consisting of novolak photoresist materials and Poly Methyl Meth Acrylate (PMMA) photoresist materials.

16. The method of claim 9 wherein the oxygen plasma hardening pre-treatment composition employs an oxygen flow of about 10 to about 3000 standard cubic centimeters per minute and a reactor chamber pressure of about 1 to about 20 mtorr for a pre-treatment time period of about 5 to about 60 seconds.

17. The method of claim 9 wherein the subsequent plasma etch method is chosen from the group of plasma etch methods consisting of Reactive Ion Etch (RIE) plasma etch methods, Magnetically Enhanced Reactive Ion Etch (MERIE) plasma etch methods and Electron Cyclotron Resonance (ECR) plasma etch methods.

18. The method of claim 1 further comprising forming within and upon the semiconductor substrate a series of semiconductor devices, thus forming within and upon the semiconductor substrate an integrated circuit.

* * * * *